United States Patent
Lee et al.

(10) Patent No.: US 9,290,852 B2
(45) Date of Patent: Mar. 22, 2016

(54) LIGHT ABSORBING LAYER FOR PHOTOELECTRODE STRUCTURE, PHOTOELECTRODE STRUCTURE INCLUDING THE SAME, AND PHOTOELECTROCHEMICAL CELL INCLUDING THE PHOTOELECTRODE STRUCTURE

(71) Applicant: Samsung Electronics Co., Ltd., Suwon-si, Gyeonggi-do (KR)

(72) Inventors: Jeong-hee Lee, Seongnam-si (KR); Tae-gon Kim, Hwaseong-si (KR); Tae-hyung Kim, Seoul (KR); Seoung-jae Im, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 157 days.

(21) Appl. No.: 14/076,355

(22) Filed: Nov. 11, 2013

(65) Prior Publication Data

US 2014/0238847 A1 Aug. 28, 2014

(30) Foreign Application Priority Data

Feb. 26, 2013 (KR) .................. 10-2013-0020669

(51) Int. Cl.
| | |
|---|---|
| *C25B 11/00* | (2006.01) |
| *C25B 11/04* | (2006.01) |
| *C25B 1/00* | (2006.01) |
| *H01L 31/0224* | (2006.01) |

(52) U.S. Cl.
CPC ............ *C25B 11/0478* (2013.01); *C25B 1/003* (2013.01); *H01L 31/0224* (2013.01)

(58) Field of Classification Search
CPC ........ C25B 1/003; C25B 11/00; C25B 11/04; C25B 11/0405; C25B 11/0442; C25B 11/0478
USPC ................. 204/280, 290.01, 290.03, 290.08, 204/290.12, 290.14; 428/632
See application file for complete search history.

(56) References Cited

U.S. PATENT DOCUMENTS

| | | | |
|---|---|---|---|
| 2009/0321244 A1 | 12/2009 | Smith et al. | |
| 2012/0152335 A1 | 6/2012 | Shiu et al. | |
| 2012/0152337 A1 | 6/2012 | Aytug et al. | |
| 2012/0160298 A1 | 6/2012 | Kanamoto et al. | |

FOREIGN PATENT DOCUMENTS

| | | |
|---|---|---|
| JP | 2002-246624 A | 8/2002 |
| JP | 2003-282906 A | 10/2003 |
| JP | 2007-019460 A | 1/2007 |

OTHER PUBLICATIONS

Mishina et al (Nano Letters, 1 (8), 2001, pp. 401-404).*
Paracchino et al (Nature Materials, vol. 10, Jun. 2011, p. 456-461).*
Gershon et al (Solar Energy Materials & Solar Cells, 96, 2012, pp. 148-154).*

(Continued)

*Primary Examiner* — Luan Van
*Assistant Examiner* — Alexander W Keeling
(74) *Attorney, Agent, or Firm* — Cantor Colburn LLP

(57) ABSTRACT

A light absorbing layer for a photoelectrode structure, the light absorbing layer including copper oxide, wherein metallic copper (Cu) is present at a grain boundary of the copper oxide. Also, a photoelectrode structure including the light absorbing layer, a photoelectrochemical cell including the photoelectrode structure, and a solar cell including the light absorbing layer.

12 Claims, 11 Drawing Sheets

(56) References Cited

OTHER PUBLICATIONS

Lee et al (Journal of Alloys and Compounds, vol. 427, issues 1-2, Jan. 2007, and pp. 213-218).*

Hussain et al., "Fabrication and Electrical Characterization of p—$Cu_2O$/n—ZnO Heterojunction", Journal of Nanoscience and Nanotechnology, vol. 12, 2012, pp. 1967-1971.

Paracchino et al., "Synthesis and Characterization of High-Photoactivity Electrodeposited $Cu_2O$ Solar Absorber by Photoelectrochemistry and Ultrafast Spectroscopy", The Journal of Physical Chemistry C, 116, 2012, pp. 7341-7350.

Paracchino et al., "Highly active oxide photocathode for photoelectrochemical water reduction", Nature Materials, vol. 10, Jun. 2011, pp. 456-461.

* cited by examiner

LIGHT ABSORBING LAYER FOR PHOTOELECTRODE STRUCTURE, PHOTOELECTRODE STRUCTURE INCLUDING THE SAME, AND PHOTOELECTROCHEMICAL CELL INCLUDING THE PHOTOELECTRODE STRUCTURE

CROSS-REFERENCE TO RELATED APPLICATIONS

This application claims priority to and the benefit of Korean Patent Application No. 10-2013-0020669, filed on Feb. 26, 2013, and all the benefits accruing therefrom under 35 U.S.C. §119, the content of which is incorporated herein in its entirety by reference.

BACKGROUND

1. Field

The present disclosure relates to a light absorbing layer for a photoelectrode structure, a photoelectrode structure including the same, and a photoelectrochemical cell (PEC) including the photoelectrode structure.

2. Description of the Related Art

Recently, research into producing hydrogen by decomposition of water using the infinite energy from the sun has been actively conducted to address the depletion of carbon-based energy resources and environmental issues caused by fuel gas emission.

To decompose water, a photocatalyst, which absorbs solar energy to generate electrons and holes, and separately generate hydrogen and oxygen, would be desirable. In general, it is known that a semiconductor with a bandgap of about 2 electron volts (eV) is suitable for simultaneously satisfying the maximization of sun light absorption and the decomposition potential of water.

Copper oxide is used as such a semiconductor. However, since copper oxide has an actual photoconversion efficiency lower than a theoretical photoconversion efficiency, there is much room for improvement.

SUMMARY

Provided is a light absorbing layer for a photoelectrode structure having an improved photoconversion efficiency.

Provided is a photoelectrode structure including the light absorbing layer.

Provided is a photoelectrochemical cell including the photoelectrode structure.

Additional aspects will be set forth in part in the description which follows and, in part, will be apparent from the description.

According to an aspect, a light absorbing layer for a photoelectrode structure includes copper oxide, wherein metallic copper (Cu) is present at a grain boundary of the copper oxide.

According to another aspect, a photoelectrode structure includes: an electrode; a light absorbing layer including copper oxide, wherein metallic copper (Cu) is present at a grain boundary of the copper oxide; a protective layer; and an electrocatalyst.

According to another aspect, a photoelectrochemical cell includes an electrode; a light absorbing layer including copper oxide, wherein metallic copper (Cu) is present at a grain boundary of the copper oxide; a protective layer; and an electrocatalyst.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
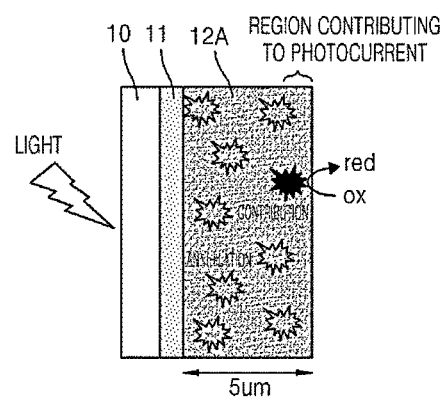
FIG. 1A is a conceptual view illustrating an embodiment of formation of charge carrier conducting paths in a photoelectrode structure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a light absorbing layer for a photoelectrode structure according to an aspect, a photoelectrode structure including the same, and a photoelectrochemical cell including the photoelectrode structure will be disclosed in more detail.

The light absorbing layer comprises copper oxide and has a structure in which metallic copper (Cu) is present at a grain boundary of the copper oxide. While not wanting to be bound by theory, it is understood that because the light absorbing layer has this structure, separation of charge carriers may be increased and recombination thereof may be prevented, and thus, an actual photoconversion efficiency of the light absorbing layer may be significantly improved.

The above-described structure may be confirmed by transmission electron microscope ("TEM") and scanning electron microscope ("SEM") analyses. The presence of voids along grain boundaries in an entire thickness region of a cross section of a copper oxide layer, and the presence of metallic copper nanoparticles on a surface of the copper oxide layer, may be respectively confirmed by TEM and SEM analyses. When a depth profile is measured or a composition in the copper oxide layer after the removal of the surface thereof is measured by X-ray photoelectron spectroscopy ("XPS") and auger electron spectroscopy ("AES"), it may be directly confirmed that a metallic copper component is present in the copper oxide layer.

Further, copper nanoparticles may be present on the surface of the light absorbing layer.

A thickness of the light absorbing layer is about 1 μm or more. In the case where the thickness of the light absorbing layer is within this range, photocurrent characteristics of the light absorbing layer may reach a satisfactory level without having limitations associated with a thinner light absorbing layer.

In a case where the thickness of the light absorbing layer is relatively small, a distance for the carrier to reach an electrode may be decreased. However, since the absorption of light may not be maximized, light may be insufficiently absorbed, and thus, a current efficiency may be limited by a thickness of a material of the light absorbing layer. Therefore, in the case where the thickness of the light absorbing layer is relatively small, photocurrent characteristics of the light absorbing layer may not reach a satisfactory level.

However, since a light absorbing layer according to an embodiment is formed to have a thickness as large as a penetration depth of a photocatalyst, a maximum amount of light that may be absorbed by the material of the light absorbing layer may be used. Therefore, and while not wanting to be bound by theory, it is understood that photo-excited charge carriers formed over a penetration depth of the light absorbing layer may move to the electrode without or with reduced annihilation and thus, the current efficiency of the light absorbing layer according to the embodiment may be improved.

For example, the thickness of the light absorbing layer may be about 2 μm or more. For example, the thickness of the light absorbing layer may be in a range of about 2 μm to about 7 μm, and for example, may be in a range of about 4 μm to about 6 μm.

A content of the metallic copper is not particularly limited. However, the content of the metallic copper, for example, may be in a range of about 0.00001 part by weight to about 0.1 part by weight, specifically about 0.0001 part by weight to about 0.01 part by weight, based on 100 parts by weight of the copper oxide.

An average particle diameter of the copper nanoparticle may be about 10 nm or less, and for example, may be in a range of about 0.001 nm to about 10 nm.

In a case where the content of the metallic copper and the average particle diameter of the copper nanoparticle are within the foregoing ranges, a photoconversion efficiency of the photoelectrode structure using the light absorbing layer is excellent and improved.

The copper oxide is a crystalline material, in which interplanar spacings of a (111) plane, a (200) plane, and a (220) plane of the copper oxide are increased in comparison to those of a copper oxide not including the metallic copper. The reason for the increases in the interplanar spacings is due to the fact that copper ions are partially reduced into copper metal.

Figure 1B:
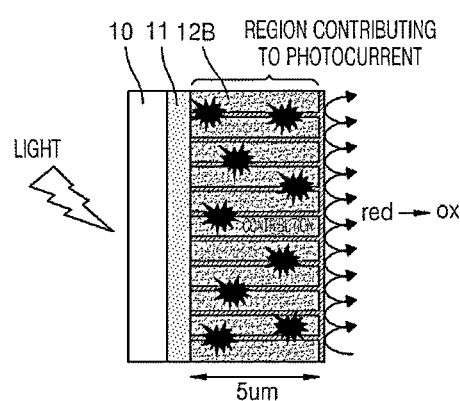
FIG. 1B is a conceptual view illustrating another embodiment of formation of charge carrier conducting paths in a photoelectrode structure.

FIG. 1A is a conceptual view illustrating the formation of charge carrier conducting paths in an embodiment of a light absorbing layer in a photoelectrode structure, and FIG. 1B is a conceptual view illustrating the formation of charge carrier conducting paths in another embodiment of a light absorbing layer in a photoelectrode structure. An action and effect of the light absorbing layer will be described below with reference to FIGS. 1A and 1B.

In order to provide a technique for water decomposition using sunlight, or a technique for artificial photosynthesis, a semiconductor material in which a minimum electromotive force of about 2 eV is generated by the absorption of the sunlight wherein the generated charges participate in a chemical reaction occurring on a surface of the photoelectrode with a high efficiency is desired. It is further desired that efficiency characteristics are also not reduced, even if the semiconductor material is operated in water over a prolonged period of time.

Copper oxide may be used as the semiconductor material.

Copper oxide ($Cu_2O$) is an inexpensive material that does not cause environmental issues. However, since copper oxide has an actual photoconversion efficiency lower than a theoretical photoconversion efficiency, there is much room for improvement.

A theoretical photocurrent of the copper oxide is about 14.7 milliamperes per square centimeter ($mA/cm^2$), and a photocurrent actually generated is much smaller than the theoretical value. One reason for the small actual photocurrent is that, as illustrated in FIG. 1A, a penetration depth of the light is about 5 micrometers (μm) at about 620 nanometers (nm), which is a bandgap of copper oxide having a light absorbing layer 12 formed on a support 10 and a conductive layer 11. However, a diffusion length of carriers is small, e.g., about 100 nm, and thus, most of the carriers are annihilated, due to electron-hole recombination, before arriving at a junction. That is, as illustrated in FIG. 1A, a region contributing to a photocurrent is relatively small.

In contrast, in the light absorbing layer according to the embodiment of FIG. 1B, which includes a light absorbing layer 14 having improved photocurrent characteristics by inclusion of metallic copper at a grain boundary of the copper oxide, conductivity of charge carriers is improved, and the photo-excited charge carriers generated from an entire penetration depth of the light are able reach an electrochemical reaction surface without the recombination. Therefore, the region contributing to a photocurrent is significantly and differently increased in the embodiment of FIG. 1B relative to that of FIG. 1A. As a result, the photocurrent characteristics of the light absorbing layer may be improved. In FIGS. 1A and 1B, "red" and "ox" respectively denote a material in a reduced state and a material in an oxidized state.

Hereinafter, a method of preparing a light absorbing layer according to an embodiment will be further described.

Figure 1C:
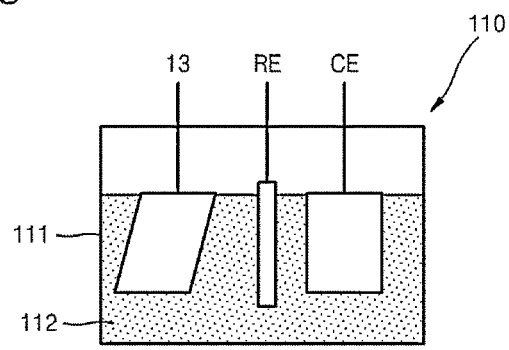
FIG. 1C is a schematic view illustrating an embodiment of a method of preparing a light absorbing layer.

FIG. 1C illustrates a configuration of a 3-electrode cell used in the preparation of the light absorbing layer.

The light absorbing layer may be prepared by electrodeposition from an aqueous electrolyte solution including a copper salt. This preparation process will be disclosed in more detail below.

First, a copper oxide layer is obtained by electrodeposition from an aqueous electrolyte solution including a copper salt.

Any suitable copper salt may be used. Copper sulfate, copper chloride, and copper acetate may be used as the copper salt.

The aqueous electrolyte solution includes a complexing agent for preventing precipitation of a hydroxide in an alkaline solution.

The complexing agent may comprise lactic acid, tartaric acid, citric acid, glycolic acid, malic acid, or a combination thereof.

A concentration of the copper salt in the electrolyte aqueous solution may be in a range of about 0.01 molar (M) to about 1 M, and a concentration of the complexing agent may be in a range of about 0.05 M to about 2 M.

Any suitable pH level of the aqueous electrolyte solution may be used, and the pH level of the electrolyte aqueous solution, for example, may be in range of about 8 to about 14, and may be in range of about 9 to about 13.

A temperature of the electrolyte aqueous solution may be selected to be in a range of about 25° C. to about 80° C. so as to increase an electrodeposition rate of the copper oxide layer, and for example, may be selected to be about 80° C. In a case where the aqueous electrolyte solution having this temperature is used, a light absorbing layer having a thickness of about 1 μm or more, for example, about 2 μm or more, may be obtained.

A method, such as constant current electrolysis and constant voltage electrolysis, using a support having a conductive layer formed thereon as a working electrode, may be used in the electrodeposition method.

Fluorinated tin oxide ("FTO"), indium tin oxide ("ITO"), or a metal (e.g., stainless steel, nickel, or carbon), or a combination thereof, may be used as the conductive layer, and a glass substrate may be used as the support.

An aqueous electrolyte solution 112 including the copper salt is introduced into a 3-electrode cell 110.

The 3-electrode cell 110 includes a container 111, and a working electrode 13, a reference electrode RE, and a counter electrode CE which are disposed in the container 111.

A support having a conductive layer, such as FTO, ITO, or a metal (e.g., stainless steel, nickel, or carbon), or a combination thereof, coated thereon may be used as the working electrode.

The reference electrode may comprise a Ag/AgCl, saturated calomel electrode ("SCE"), Hg/HgO, or a $Hg/Hg_2SO_4$ electrode. For example, a Ag/AgCl reference electrode (comprising 3 M NaCl), may be used as the reference electrode.

The counter electrode may comprise platinum, nickel, carbon, iron, or a combination thereof. For example, a platinum gauze may be used as the counter electrode.

Figure 1D:
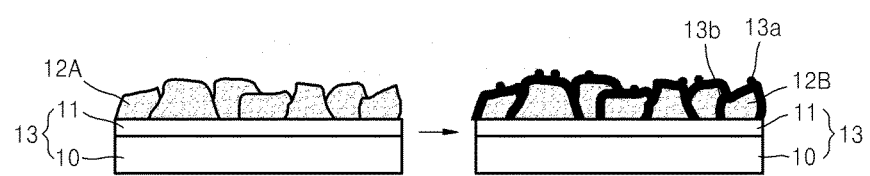
FIG. 1D is a schematic view illustrating an embodiment of a process for preparation of a light absorbing layer before and after a heat treatment.

Next, a voltage is applied between the working electrode and the reference electrode so as to form a negative potential at the working electrode, and thus, copper oxide is formed from the electrolyte aqueous solution 112 including a copper salt, and the working electrode is electrochemically coated with copper oxide. As a result, a working electrode 13 coated with a copper oxide layer 12A is obtained as illustrated in FIG. 1D.

According to an embodiment, the working electrode includes a support 10 and a conductive layer 11 formed thereon.

In order to form a copper oxide layer on the working electrode by electrodeposition, an applied potential is in a range of about −0.3 V to about −0.5 V when Ag/AgCl (3 M NaCl) is used as a reference electrode. In the case where the potential is within the above range, a light absorbing layer having improved photocurrent characteristics may be obtained.

A charging amount during the electrodeposition is in a range of about 8 Coulombs (C) to about 30 C, for example, about 16 C to about 24 C. In a case where the electrodeposition is performed within the above charge amount range, the thickness of the light absorbing layer may be easily controlled.

Thereafter, the working electrode 13 having the copper oxide layer 12A formed thereon is heat treated (e.g., by sintering) to obtain the working electrode 13 which is coated with a light absorbing layer having a structure in which metallic Cu 13b is present in a grain boundary of the copper oxide in to provide a copper oxide layer 12B. As illustrated in FIG. 1D, metallic Cu 13a may also be present on a surface of the copper oxide layer 12B.

The heat treatment may be performed at a temperature ranging from about 200° C. to about 550° C. in an oxygen-free atmosphere.

The oxygen-free atmosphere is a non-oxidizing atmosphere which may be formed using an inert gas. The inert gas may comprise nitrogen gas or argon gas, for example.

In a case where the heat treatment temperature is less than about 200° C., metallic Cu may not be formed between the grain boundaries of the copper oxide, and thus, a light absorbing layer having improved photocurrent characteristics may not be obtained. In the case in which the heat treatment temperature is greater than about 550° C., adhesion between the light absorbing layer and the substrate having the light absorbing layer formed thereon may be reduced to decrease photocurrent characteristics.

A duration of the heat treatment is not particularly limited and any suitable time may be used. According to an embodiment, the heat treatment time is about 10 minutes or more, specifically about 10 minutes to about 200 minutes, for example, about 30 minutes.

According to another aspect, a photoelectrode structure including the above-described light absorbing layer is provided.

According to another aspect, a photoelectrode structure including a light absorbing layer prepared according to the above-described method of preparing a light absorbing layer is provided.

In a photoelectrode structure according to an embodiment, the above-described light absorbing layer is formed on the electrode and a protective layer for preventing photocorrosion of the light absorbing layer and an electrocatalyst are each disposed on the light absorbing layer.

Tantalum (Ta), titanium (Ti), and niobium (Nb) metal layers, which are difficult to etch in an aqueous solution, may be used as the protective layer.

A method, such as deposition or sputtering, may be used as a process of disposing the electrocatalyst.

While not wanting to be bound by theory, it is understood that the electrocatalyst acts to decrease activation energy of a chemical reaction when excited electrons and excited holes generated in the photoelectrode participate in the chemical reaction.

The electrocatalyst may be present as a continuous or discontinuous coating layer, or may be present as an electrocatalyst particle.

For example, the electrocatalyst may comprise platinum (Pt), palladium (Pd), rhodium (Rh), ruthenium (Ru), iridium (Ir), nickel molybdenum (NiMo), nickel molybdenum zinc (NiMoZn), nickel molybdenum nitride (NiMoNx, 0.1≤x≤2), molybdenum sulfide ($MoS_2$ or $Mo_3S_4$), cobalt-phosphate (Co-Pi), cobalt oxide ($CO_3O_4$), cobalt phosphorus (CoP), iridium oxide ($IrO_2$), ruthenium oxide ($RuO_2$), or rhodium oxide ($Rh_2O_3$), or a combination thereof.

In the case where the photoelectrode structure is a photocathode, Pt, NiMo, NiMoZn, $MoS_2$ or $Mo_3S_4$, which is suitable for proton reduction, may be used as the electrocatalyst.

In the case where the photoelectrode structure is a photoanode, Ir, $IrO_2$, Ru, $RuO_2$, $Co_3O_4$, or Co-Pi, which is suitable for water oxidation, may be used as the electrocatalyst.

The electrode has a structure in which a conductive layer is disposed on a support.

The conductive layer includes one or more of a metal and an oxide conductor. The metal may comprise stainless steel, nickel, aluminum (Al), silver (Ag), or Cu, or an alloy thereof, or a combination thereof. The oxide conductor may comprise fluorine doped tin oxide, i.e., $SnO_2$:fluorine ("FTO")), $In_2O_3$:Sn ("ITO"), ZnO:Al, or $TiO_2$:Nb, or a combination thereof. For example, the conductive layer may have the form of an optically transparent metal grid.

A glass substrate may be used as the support.

For example, a glass substrate having FTO deposited thereon may be used as the electrode.

According to another aspect, a photoelectrochemical cell including the foregoing photoelectrode structure is provided.

The photoelectrochemical cell may be a hydrogen generation device using water decomposition.

Figure 2:
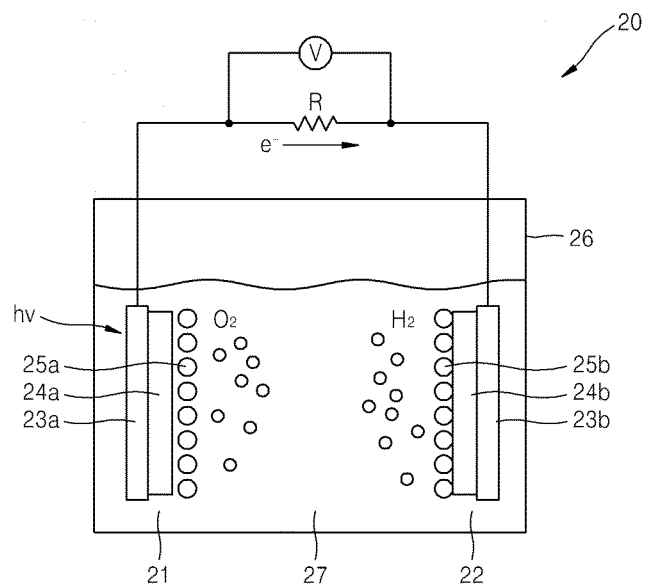
FIG. 2 illustrates an embodiment of a photoelectrochemical cell.

FIG. 2 illustrates a structure of a photoelectrochemical cell according to an embodiment.

Referring to FIG. 2, a non-restrictive arrangement of a photoelectrochemical cell 20 includes a chamber 26, a photoanode structure 21, a photocathode structure 22, and an electrolyte aqueous solution 27. In an embodiment, the photoelectrochemical cell 20 may include a resistor.

The photocathode structure 22 may be the photoelectrode structure disclosed herein.

The photoanode structure 21 comprises an electrode 23a, a light absorbing layer 24a, and an electrocatalyst 25a, and the photocathode structure 22 may comprise an electrode 23b, a light absorbing layer 24b, and an electrocatalyst 25b.

As a non-limiting example, the electrocatalysts 25a and 25b may be present as an electrocatalyst layer. An average thickness of the electrocatalyst layer may be selected according to a voltage applied to the electrode, the length of time, a type of the electrolyte aqueous solution, and a surface area of the electrode. The average thickness is not particularly limited, but, for example, is in a range of about 10 nm to about 2,000 nm.

Electrons are moved to the photoanode as an oxidation electrode through internal and external circuits of the light absorbing layers 24a and 24b, and holes oxidize water ($H_2O$) to generate oxygen (Reaction Formula 1). In the photocathode as a reduction electrode, $H^+$ ions are reduced to generate hydrogen (Reaction Formula 2).

$$H_2O + 2h^+ \rightarrow 2H^+ + \tfrac{1}{2}O_2 \quad \text{Reaction Formula 1}$$

$$2H^+ + 2e^- \rightarrow H_2 \quad \text{Reaction Formula 2}$$

In the case where the photoelectrochemical cell is not immersed in water and the water decomposition is not performed, the photoelectrochemical cell may be used as a solar cell by an electromotive force formed by the separation of electron-hole pairs.

The solar cell includes the light absorbing layer according to the embodiment.

Since the solar cell includes a copper oxide layer having low manufacturing costs and no significant environmental issues as a light absorbing layer, a photoconversion efficiency thereof may increase, and thus, the efficient use of sunlight may be possible.

Hereinafter, the present disclosure will be further exemplified, according to the following examples. However, the scope of the present disclosure is not limited thereto.

EXAMPLES

Example 1

Preparation of Light Absorbing Layer and Photoelectrode Structure

First, a 0.06 molar (M) copper sulfate aqueous solution, 0.95 M lactic acid solution, and 0.16 M $K_2HPO_4$ solution were mixed and an aqueous electrolyte solution having a pH level of about 12 and a temperature of about 60° C. was prepared by using potassium hydroxide. The aqueous electrolyte solution was introduced into a 3-electrode cell in which a working electrode (glass substrate, thickness: about 2.8 mm, size: about 30 mm×about 25 mm) having a FTO layer (thickness: about 0.6 μm) formed thereon, a reference electrode (Ag/AgCl (3 M KCl)), and a counter electrode (platinum gauze) were installed as in FIG. 1C.

Subsequently, when a voltage of about −0.4 V (based on the Ag/AgCl electrode) was applied to the working electrode, a copper oxide layer was formed while a current density ranging from about 0.2 milliamperes per square centimeter (mA/cm²) to about 3 mA/cm² was generated (the current density gradually decreased after an initial increase). In a case where a charging amount of about 24 Coulombs (C) was applied to perform electrochemical coating, a working electrode coated with a copper oxide layer having a thickness/area of about 5 μm/about 5.4 cm² was obtained.

Thereafter, the working electrode coated with a copper oxide layer was heat treated at about 400° C. for about 30 minutes in a vacuum to prepare a photoelectrode structure having a light absorbing layer.

Examples 2 to 8

Preparation of Light Absorbing Layers and Photoelectrode Structures

Photoelectrode structures having a light absorbing layer were prepared in the same manner as Example 1 except that charging amounts during electrochemical coating were respectively changed to about 4 C, about 8 C, about 12 C, about 16 C, about 20 C, about 24 C, and about 28 C, and a heat treatment atmosphere was changed to a nitrogen gas atmosphere.

Examples 9 to 12

Preparation of Light Absorbing Layers and Photoelectrode Structures

Photoelectrode structures having a light absorbing layer were prepared in the same manner as Example 1 except that heat treatment temperatures of a working electrode coated with a copper oxide layer were respectively changed to about 200° C., about 300° C., about 500° C., and about 550° C.

Thicknesses of the light absorbing layers prepared according to Examples 1 to 11 are presented in Table 1 below.

TABLE 1

| Category | Thickness (μm) |
|---|---|
| Example 1 | 6 |
| Example 2 | 1 |
| Example 3 | 2 |
| Example 4 | 3 |
| Example 5 | 4 |
| Example 6 | 5 |
| Example 7 | 6 |
| Example 8 | 7 |
| Example 9 | 6 |
| Example 10 | 6 |
| Example 11 | 6 |
| Example 12 | 6 |

Comparative Example 1

Preparation of Light Absorbing Layer and Photoelectrode Structure

A photoelectrode structure having a light absorbing layer was prepared in the same manner as Example 1 except that a process of heat treating a working electrode coated with a copper oxide layer was not performed.

Comparative Example 2

Preparation of Light Absorbing Layer and Photoelectrode Structure

A photoelectrode structure having a light absorbing layer was prepared in the same manner as Example 6 except that the heat treatment temperature of a working electrode coated with a copper oxide layer was changed to about 100° C.

With respect to the light absorbing layer formed according to Comparative Example 2, the presence of copper may not be confirmed in the light absorbing layer, which is different from Examples 1 to 12.

Evaluation Example 1

Transmission Electron Microscope (TEM) and Scanning Electron Microscope (SEM) Analyses

1) TEM

TEM analyses were respectively performed on the light absorbing layers prepared according to Example 1 and Comparative Examples 1 and 2. A Tecnai Titan by FEI was used during the TEM analyses.

Figure 3A:
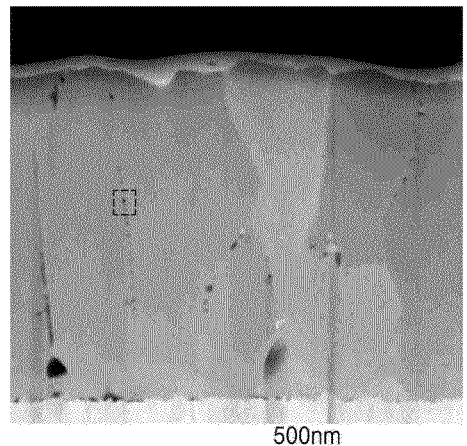
FIG. 3A illustrates a result of transmission electron microscope ("TEM") analysis of a light absorbing layer prepared according to Example 1.
Figure 3B:
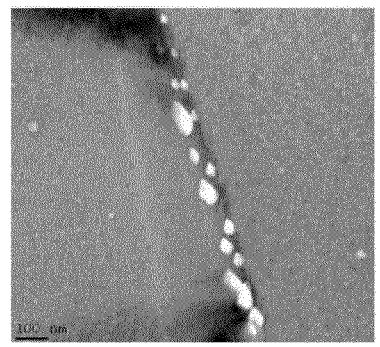
FIG. 3B is an enlarged view of FIG. 3A.
Figure 3C:
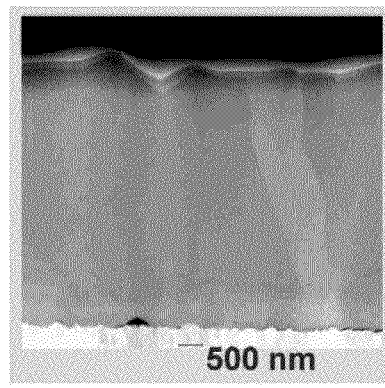
FIG. 3C illustrates a result of TEM analysis of a light absorbing layer prepared according to Comparative Example 1.

Results of TEM analyses of the light absorbing layers prepared according to Example 1 and Comparative Example 1 are respectively presented in FIG. 3A, FIG. 3B, and FIG. 3C. FIG. 3B is an enlarged image of the area marked by an arrow in FIG. 3A.

Referring to FIGS. 3A and 3B, it may be observed that white spots appeared indicating voids existing along grain boundaries of copper oxide in the light absorbing layer prepared according to Example 1. These white spots may be attributed to sites in which oxygen was removed by a reaction expressed as the following Reaction Formula 3 during the heat treatment.

$$Cu_2O \rightarrow Cu + \tfrac{1}{2}O_2 \qquad \text{Reaction Formula 3}$$

In contrast, as illustrated in FIG. 3C, white spots as in FIG. 3A or 3B were not observed in the light absorbing layer prepared according to Comparative Example 1.

Also, white spots as in FIG. 3A or 3B were not observed in the light absorbing layer prepared according to Comparative Example 2 similar to the case of Comparative Example 1.

2) SEM

SEM analyses were respectively performed on the light absorbing layers prepared according to Example 1 and Comparative Examples 1 and 2. A Hitachi S-4700 instrument was used for the SEM analyses.

Figure 4A:
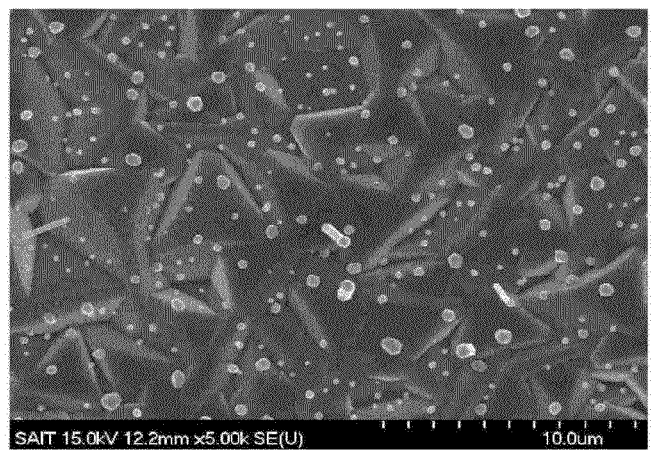
FIG. 4A illustrates a result of scanning electron microscope ("SEM") analysis of a surface of the light absorbing layer prepared according to Example 1.
Figure 4B:
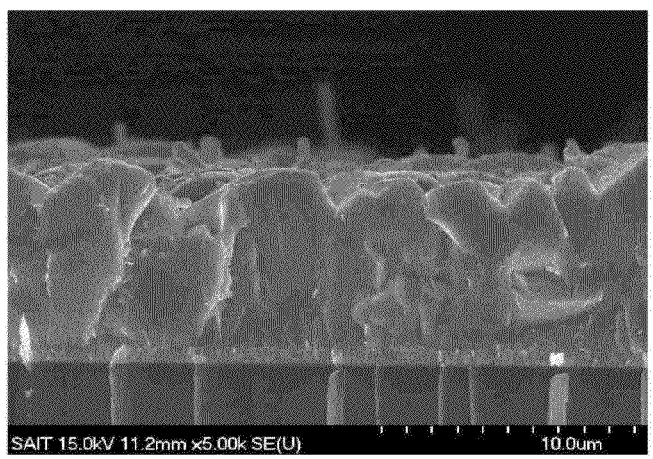
FIG. 4B illustrates a result of SEM analysis on a cross section of the light absorbing layer prepared according to Example 1.
Figure 5A:
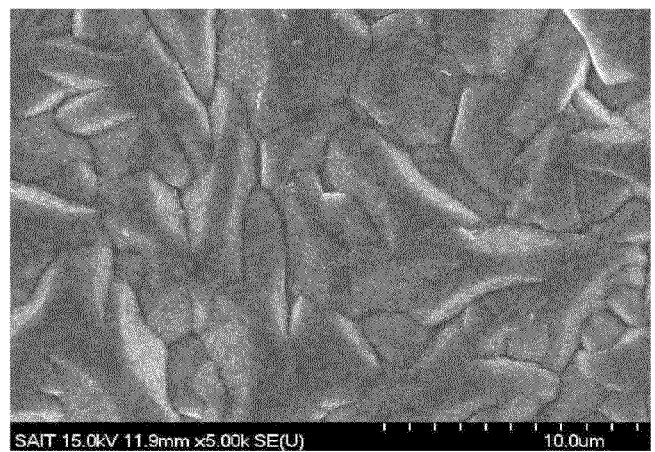
FIG. 5A illustrates a result of SEM analysis on a surface of the light absorbing layer prepared according to Comparative Example 1.
Figure 5B:
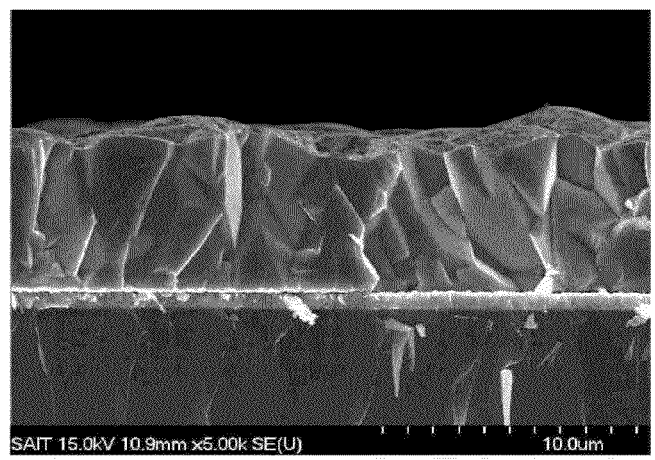
FIG. 5B illustrates a result of SEM analysis on a cross section of the light absorbing layer prepared according to Comparative Example 1.

Results of the SEM analyses are respectively presented in FIGS. 4A and 4B, and FIGS. 5A and 5B. Herein, FIGS. 4A and 5A are respectively the results of SEM analysis on surfaces of the light absorbing layers in Example 1 and Comparative Example 1, and FIGS. 4B and 5B are respectively the results of SEM analysis on cross sections of the light absorbing layers in Example 1 and Comparative Example 1.

It may be understood from the above results that the light absorbing layer according to Example 1 had copper nanoparticles formed on a surface of a copper oxide layer, which is different from the light absorbing layer of Comparative Example 1.

Also, it may be confirmed that the light absorbing layer of Comparative Example 2 had no copper nanoparticles formed on a surface of a copper oxide layer similar to the case of Comparative Example 1.

Evaluation Example 2

X-Ray Photoelectron Spectroscopy (XPS) and Auger Electron Spectroscopy (AES) Analyses XPS/AES analyses were simultaneously performed on the light absorbing layers prepared according to Example 1 and Comparative Example 1 to measure binding energy and kinetic energy of Cu(2p), and Cu-LMM(dN/dE) Auger signals were recorded and compared. A Quantum 2000 Scanning ESCA Microprobe by Physical Electronics, Inc. was used for the XPS/AES analyses and monochromatic Al Kα (K-alpha: 1486.6 eV) having a beam diameter of about 100 μm was used as a source power.

Figure 6A:
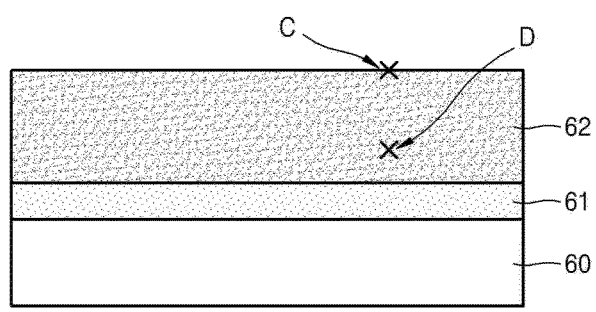
FIG. 6A is a cross-sectional view schematically illustrating a photoelectrode structure prepared according to Example 1.
Figure 6B:
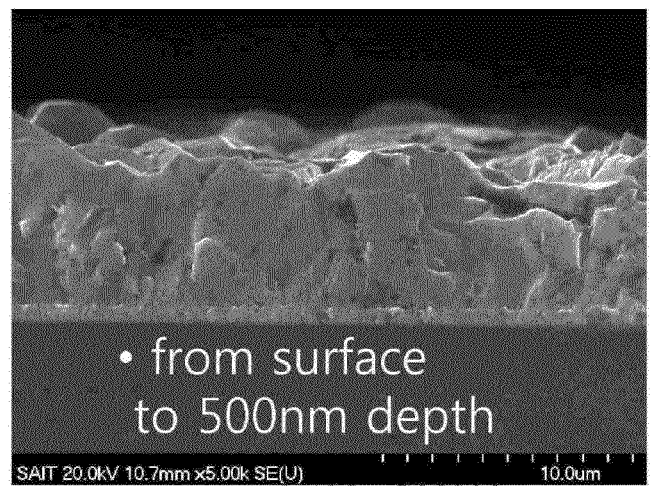
FIG. 6B illustrates a result of SEM analysis on a region C at a distance of about 0.5 micrometer (μm) from a surface of a light absorbing layer in FIG. 6A.

FIG. 6A illustrates a structure in which a light absorbing layer 62 prepared according to Example 1 was stacked on a FTO layer 61 formed on a glass substrate 60. An SEM micrograph of a region C at a distance of about 0.5 μm (500 nm) from a surface of the light absorbing layer 62 is illustrated in FIG. 6B and results of the XPS/AES analyses are presented in FIG. 6D.

Figure 6C:
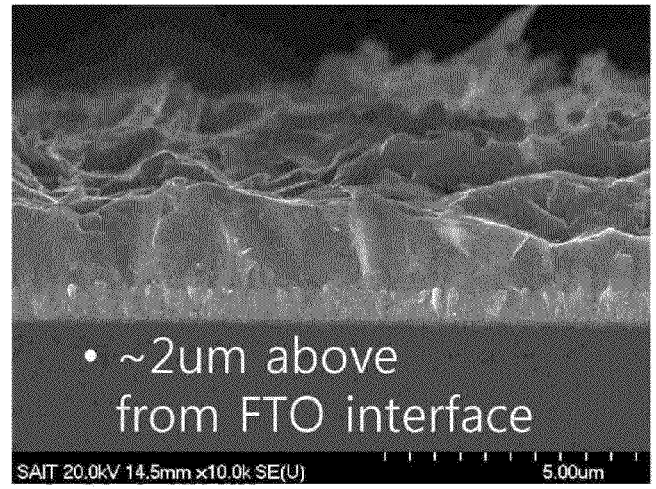
FIG. 6C illustrates a result of SEM analysis on a region D at a distance of about 2 μm from a region adjacent to a fluorinated tin oxide ("FTO") layer in the light absorbing layer in FIG. 6A.
Figure 6D:
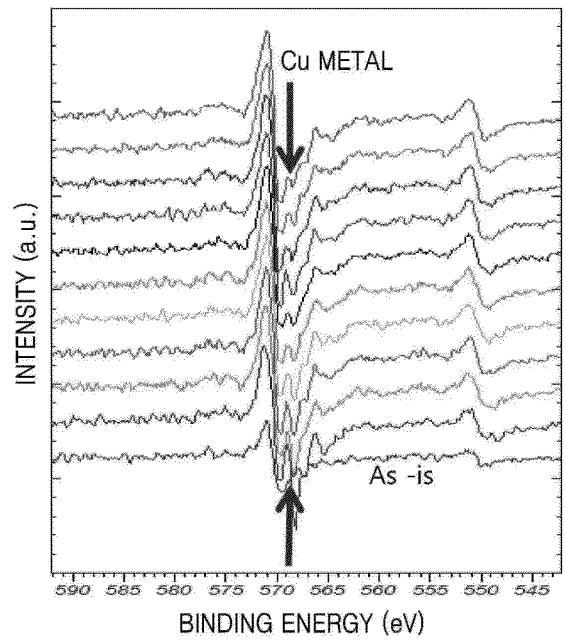
FIG. 6D is graph of intensity (arbitrary units, a.u.) versus binding energy (electron volts, eV) which illustrates a result of differentiation (dN/dE) of a copper (Cu) LMM spectrum after X-ray photoelectron spectroscopy ("XPS") and auger electron spectroscopy ("AES") analyses are performed on the region C at a distance of about 0.5 μm from the surface of the light absorbing layer in FIG. 6A.

In FIG. 6D, in order to investigate the depth profile of the light absorbing layer, the measurements were sequentially performed by sputtering a copper oxide layer, the surface of the light absorbing layer, for about 20 minutes using a 3 keV argon ion beam. The presence of a Cu metal component was confirmed by differentiation (dN/dE) of a Cu LMM spectrum.

Figure 6E:
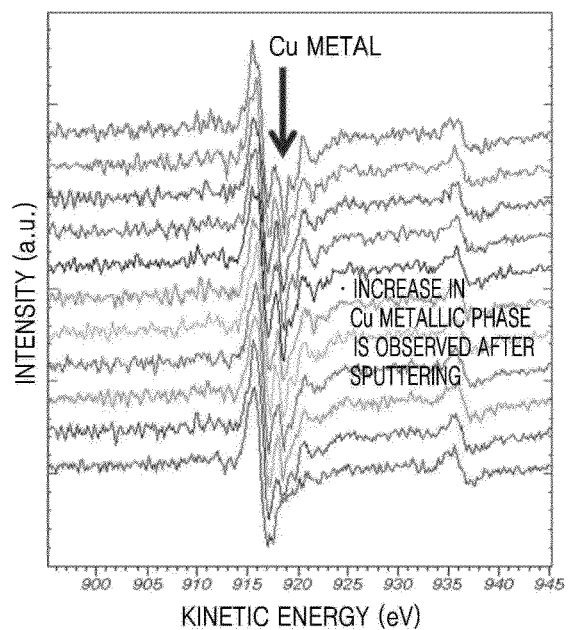
FIG. 6E is graph of intensity (arbitrary units, a.u.) versus kinetic energy (electron volts, eV) which illustrates a result of differentiation of a Cu LMM spectrum after XPS/AES analyses are performed on the region D at a distance of about 2 μm from a region adjacent to the FTO layer in the light absorbing layer in FIG. 6A.

An SEM micrograph of a region D at a distance of about 2 μm from a region adjacent to the FTO layer 61 in the light absorbing layer 62 of FIG. 6A is illustrated in FIG. 6C and results of the XPS/AES analyses are presented in FIG. 6E. FIG. 6E is the results obtained by sputtering Cu, the surface of the light absorbing layer, for about 35 minutes using a 3 keV argon ion beam in order to investigate the depth profile of the light absorbing layer. According to the results of the analyses, it may be understood that a partial reduction of the copper oxide layer into Cu metal occurred over almost an entire thickness region by a vacuum heat treatment.

Figure 6F:
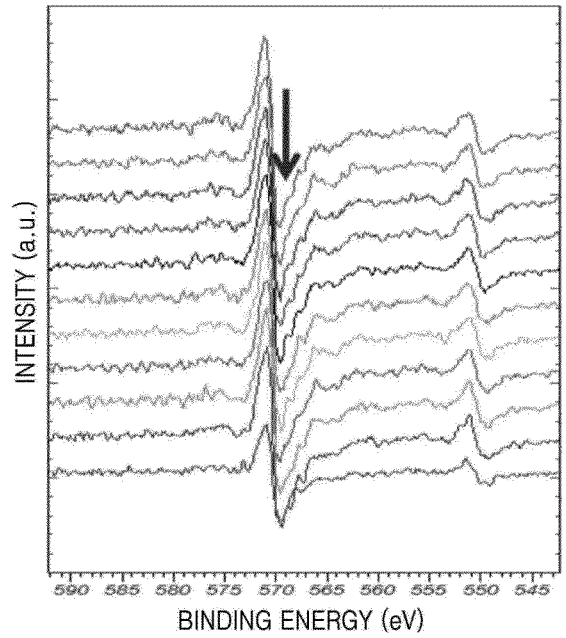
FIG. 6F is graph of intensity (arbitrary units, a.u.) versus binding energy (electron volts, eV) which illustrates a result of differentiation of a Cu LMM spectrum after XPS/AES analyses are performed on a region C at a distance of about 0.5 μm from a surface of a light absorbing layer prepared according to Comparative Example 1.

FIG. 6F illustrates results of XPS/AES analyses on a region at a distance of about 0.5 μm from the surface of the light absorbing layer prepared according to Comparative Example 1 as in the case of FIG. 6D.

With respect to the light absorbing layer prepared according to Example 1, the presence of Cu metal at positions marked by arrows may be confirmed as illustrated in FIGS. 6D and 6E. In contrast, with respect to the light absorbing layer prepared in Comparative Example 1, peaks related to Cu metal were difficult to identified as illustrated in FIG. 6F. Thus, it may be clearly understood that Cu metal is present on the surface and inside the light absorbing layer according to Example 1.

Evaluation Example 3

Photocurrent Measurement According to Thickness of Light Absorbing Layer

In Evaluation Example 3, an effect of increasing a photocurrent according to a thickness (about 1 μm to 7 μm) of a light absorbing layer adjusted by changing a charging amount (about 4 C to 28 C applied to an electrode area of about 5.4 $cm^2$) during electrochemical coating was measured in order to identify an optimum thickness of the light absorbing layer for the formation of charge carrier conducting paths by the heat treatment.

Photocurrents of the light absorbing layers according to Examples 2 to 8 were measured as follows.

A 3-electrode cell filled with the electrolyte aqueous solution of FIG. 2 was used as an experimental apparatus for evaluating a photocurrent.

Photoelectrode structures having a light absorbing layer prepared according to Examples 2 to 8 were respectively used as a working electrode of the 3-electrode cell.

Ag/AgCl (3 M NaCl) was used as a reference electrode, a platinum gauze was used as a counter electrode, and 1 M $Na_2SO_4$ aqueous solution with a pH level of about 5.2 was used as an electrolyte aqueous solution. A voltage scan rate during linear scan voltammetry (measured changes in current by voltage scan) using a PARSTAT 2273 potentiostat was about 10 millivolts per second (mV/s).

The light was illuminated by using a xenon (Xe) lamp with an AM 1.5 filter by Newport Corporation in a direction of the back of the working electrode of the 3-electrode cell respectively including the photoelectrode structures according to Examples 2 to 8 as a working electrode, and at this time, a digital exposure controller was installed to measure a photocurrent while the light went on and off at two second intervals.

Figure 7:
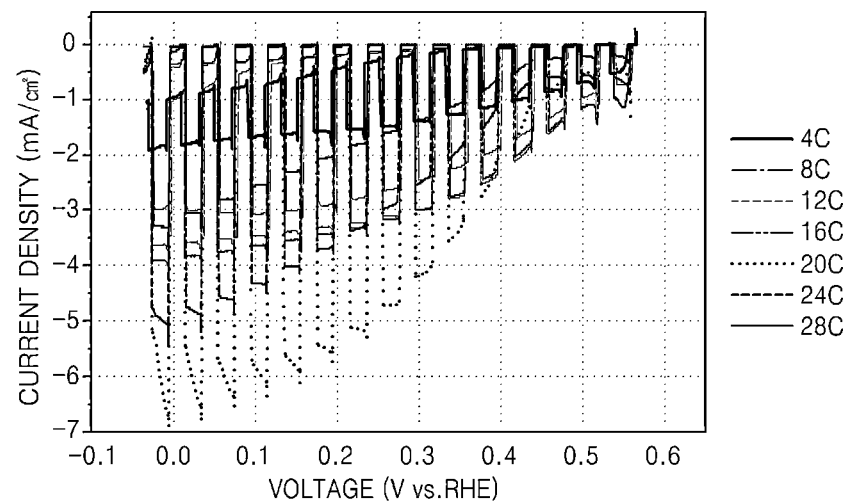
FIG. 7 is a graph of current density (milliamperes per square centimeter, mA/cm$^2$) versus voltage (volts (V) vs a reversible hydrogen electrode ("RHE")) which illustrates results of photocurrent measurements of light absorbing layers prepared according to Examples 2 to 8.

Results of the measurement are presented in FIG. 7. Curves represent as 4 C, 8 C, 12 C, 16 C, 20 C, 24 C, and 28 C were respectively related to the light absorbing layers prepared according to Examples 2 to 8.

Referring to FIG. 7, it may be understood that the photocurrent was the highest for a charging amount of 20 C and the optimum thickness of the light absorbing layer was in a range of about 5 μm to about 6 μm. That is, a value of the photocurrent after the heat treatment was the highest in a case where the charging amount applied during the coating was in a range of about 3.5 $C/cm^2$ to about 4.5 $C/cm^2$.

Evaluation Example 4

Photocurrent Measurement According to Heat Treatment Temperature of Light Absorbing Layer Photocurrents of the light absorbing layers prepared according to Examples 1 and 9 to 12 were measured by using the experimental apparatus for evaluating a photocurrent used in Evaluation Example 3.

Figure 8:
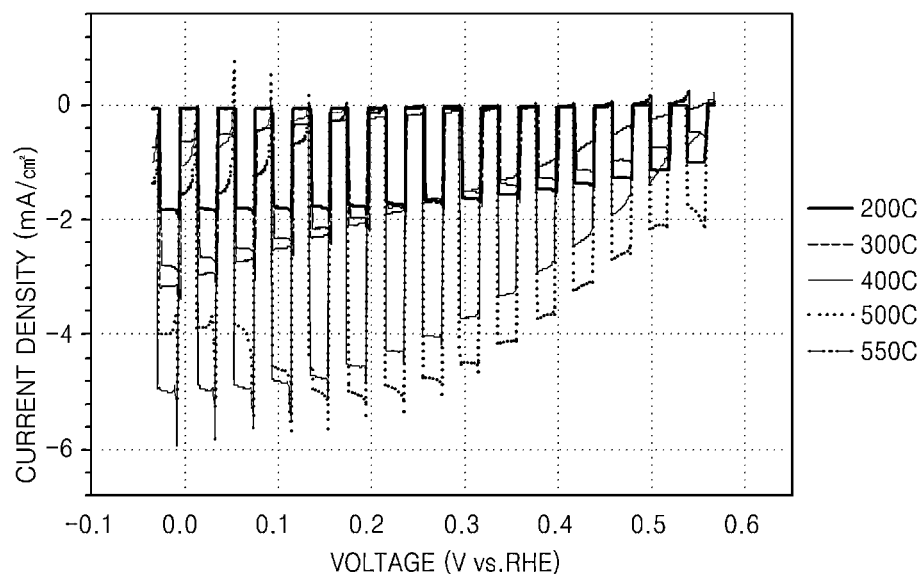
FIG. 8 is a graph of current density (milliamperes per square centimeter, mA/cm$^2$) versus voltage (V vs RHE) which illustrates results of photocurrent measurements of light absorbing layers prepared according to Examples 1 and 9 to 12.

Results of the measurement are presented in FIG. 8. Curves indicated as 200 C, 300 C, 400 C, 500 C, and 550 C were respectively related to the light absorbing layers prepared according to Examples 9, 10, 1, 11, and 12.

Referring to FIG. 8, photocurrent characteristics of the light absorbing layers (in a case where the heat treatment temperatures were about 400° C. and about 500° C.) prepared according to Examples 1 and 11 were excellent, and with respect to the light absorbing layer (in a case where the heat treatment temperature was about 550° C.) prepared according to Example 12, a phenomenon was exhibited in which the photocurrent was again decreased in comparison to the case of Example 11 (in the case where the heat treatment temperature was about 500° C.). While not wanting to be bound by theory, it is believed that such phenomenon may be due to the fact that although an effect of the heat treatment was higher in the case where the heat treatment temperature was about 550° C., adhesion of the light absorbing layer with respect to the glass substrate was reduced because a large difference between a thermal expansion coefficient of copper oxide ($Cu_2O$) constituting the light absorbing layer and a thermal expansion coefficient of glass occurred at this time, and thus, the photocurrent was again decreased in comparison to the case of Example 11 (in a case where the heat treatment temperature was about 500° C.).

Evaluation Example 5

Photocurrent Measurement of Light Absorbing Layer According to Direction of Illumination Photocurrents of samples with no vacuum heat treatment were measured according to directions of illumination by using the apparatus for evaluating a photocurrent used in Evaluation Example 3.

Photoelectrode structures having a light absorbing layer prepared according Example 1 and Comparative Example 1 were respectively used as a working electrode of the 3-electrode cell.

Figure 9:
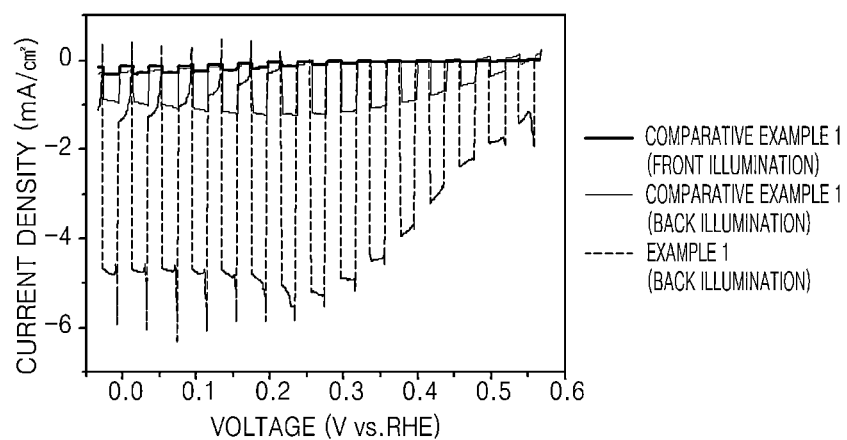
FIG. 9 is a graph of current density (milliamperes per square centimeter, mA/cm$^2$) versus voltage (V vs RHE) which illustrates results of photocurrent measurements of the light absorbing layers prepared according to Example 1 and Comparative Example 1.

An effect of increasing the photocurrent by the heat treatment is illustrated in FIG. 9. In the case where the photocurrent was measured under a condition of back illumination (AM1.5 light) of the light absorbing layer having a thickness of about 6 μm, it was confirmed that the photocurrent after the heat treatment was significantly increased by about 30 times the photocurrent before the heat treatment. Also, the photocurrent under the front illumination of the light absorbing layer before the heat treatment was increased by about 16 times in comparison to the case of the back illumination. Such results supported that photo-excited charge carriers generated in the $Cu_2O$ layer were again recombined and annihilated before reaching the electrode.

Evaluation Example 6

Evaluation of Crystallinity by X-Ray Diffraction Analysis

X-ray diffraction (XRD) analysis was performed on the photoelectrode structures having a light absorbing layer prepared according to Examples 1 and 9 to 12, and Comparative Example 1. The XRD analysis was performed by using a Rigaku RINT2200HF+ diffractometer using Cu Kα radiation (1.540598 Å).

Figure 10:
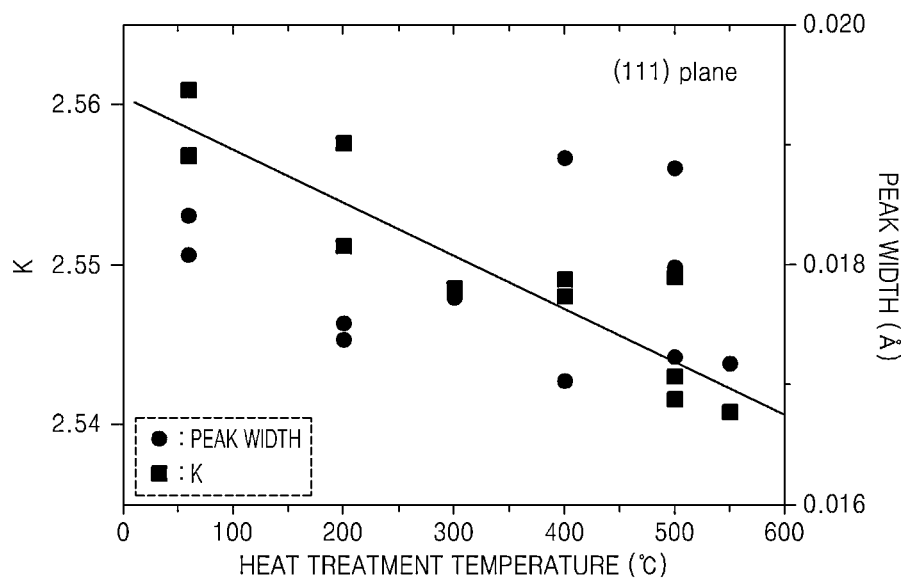
FIG. 10 is a graph of reciprocal lattice spacing (k) (reciprocal Angstroms, Å$^{-1}$) and peak width (Angstroms, Å) versus heat treatment temperature (° C.) which illustrates a result of analysis of a reciprocal lattice spacing (k) and crystallinity (peak width) of a Cu$_2$O (111) plane after X-ray diffraction ("XRD") analysis is performed in order to investigate changes in crystallinity of light absorbing layers according to a heat treatment temperature.
Figure 11:
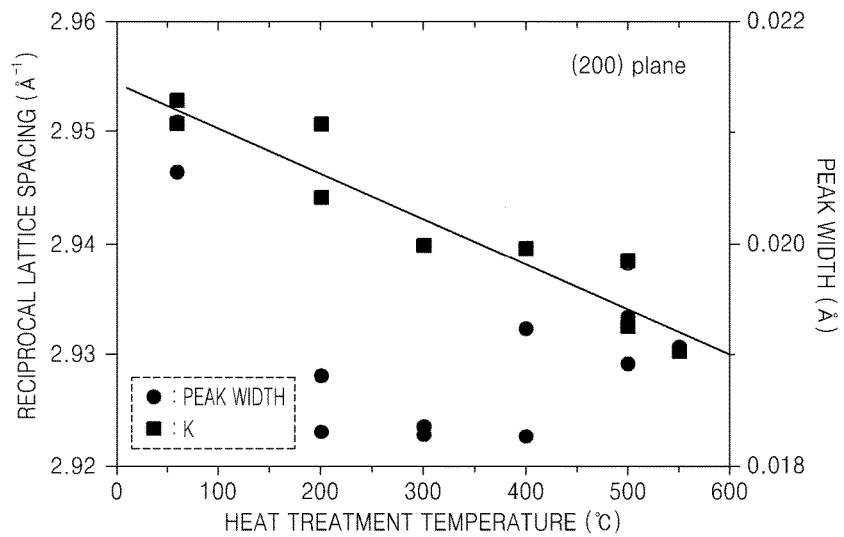
FIG. 11 is a graph of reciprocal lattice spacing (k) (reciprocal Angstroms, Å$^{-1}$) and peak width (A) versus heat treatment temperature (° C.) which illustrates a result of XRD analysis of a Cu$_2$O (200) plane performed in the same manner as in FIG. 10.
Figure 12:
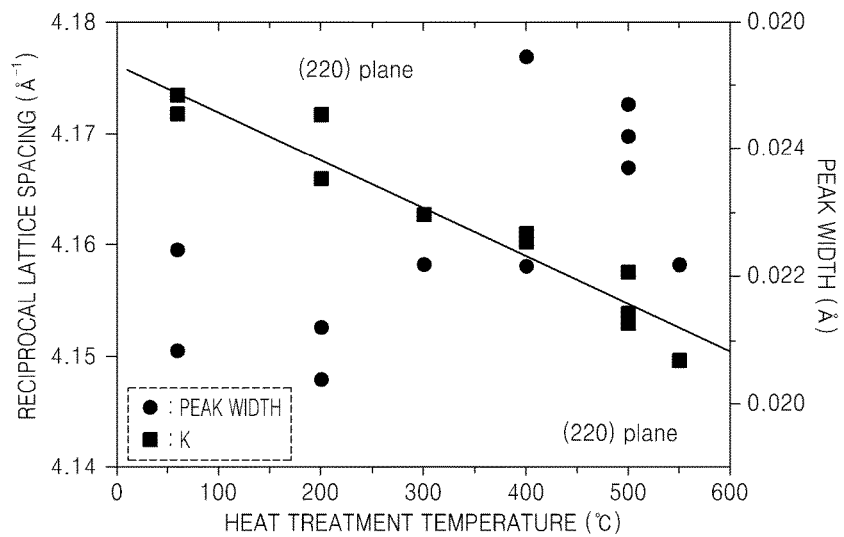
FIG. 12 is a graph of reciprocal lattice spacing (k) (reciprocal Angstroms, Å$^{-1}$) and peak width (A) versus heat treatment temperature (° C.) which illustrates a result of XRD analysis of a Cu$_2$O (220) plane performed in the same manner as in FIG. 10.

Results of the XRD analysis are presented in FIGS. 10 to 12.

FIGS. 10 to 12 illustrate a reciprocal lattice spacing (k) (Angstroms, Å) and a peak width (Angstroms, Å) of each diffraction plane, i.e., $Cu_2O$ (111), (200), and (220) planes, in an XRD spectrum of the samples according to a temperature of the vacuum heat treatment.

A spacing (d) of each crystal plane may be calculated from k values in FIGS. 10 to 12 by using the following Equation 1.

$$K=2\pi/d \qquad \text{Equation 1}$$

Referring to FIGS. 10 to 12, spacings (d) of (111), (200), and (220) planes tended to increase according to the increase in the heat treatment temperature of the light absorbing layer.

Referring to FIG. 10, the interplanar spacing of the respective (111), (200), and (220) planes of the light absorbing layers prepared according to Examples 1 and 9 to 12 was increased in comparison to the case of Comparative Example 1. The increase in the interplanar spacing according to the heat treatment temperature is related to the reduction of copper ions.

Also, a decrease in peak width according to the increase in heat treatment temperature was not observed, and thus, and while not wanting to be bound by theory, it may be understood that an effect of improving crystallinity by the heat treatment was insignificant. According to results of the analysis, the increase in the interplanar spacing may be suggested as indirect evidence of an increase in the photoconversion efficiency.

A photoconversion efficiency of a light absorbing layer according to an embodiment is improved. A photoelectrode structure including the light absorbing layer may effectively separate electron-hole pairs that are generated and may prevent recombination thereof. Therefore, in a case where the photoelectrode structure including the above-described light absorbing layer is included, a photoelectrochemical cell having improved efficiency may be prepared.

While the present disclosure has been particularly shown and described with reference to exemplary embodiments thereof, it will be understood by those of ordinary skill in the art, that various changes in form and details may be made therein without departing from the spirit and scope of the present disclosure as defined by the following claims.

What is claimed is:

1. A photoelectrode structure comprising:
an electrode;
a light absorbing layer comprising copper oxide, wherein metallic copper (Cu) is present in the form of particles and wherein the particles of the metallic copper are within a grain boundary of the copper oxide;
a protective layer; and
an electrocatalyst.

2. The photoelectrode structure of claim 1, further comprising a copper nanoparticle on a surface of the light absorbing layer.

3. The photoelectrode structure of claim 1, wherein a thickness of the light absorbing layer is about 1 micrometer or more.

4. The photoelectrode structure of claim 3, wherein the thickness of the light absorbing layer is about 2 micrometers or more.

5. A photoelectrochemical cell comprising:
an electrode;
a light absorbing layer comprising copper oxide, wherein metallic copper (Cu) is present in the form of particles and wherein the particles of the metallic copper are within a grain boundary of the copper oxide;
a protective layer;
an electrocatalyst; and
an electrolyte aqueous solution.

6. The photoelectrochemical cell of claim 5, further comprising a copper nanoparticle on a surface of the light absorbing layer.

7. The photoelectrochemical cell of claim 5, wherein a thickness of the light absorbing layer is about 1 micrometer or more.

8. The photoelectrochemical cell of claim 7, wherein the thickness of the light absorbing layer is about 2 micrometers or more.

9. The photoelectrode structure of claim 1, wherein an average particle diameter of the copper nanoparticle is about 10 nm or less.

10. The photoelectrode structure of claim 1, wherein the content of the metallic copper is in a range of about 0.00001 part by weight to about 0.1 part by weight, based on 100 parts by weight of the copper oxide.

11. The photoelectrochemical cell of claim 5, wherein the metallic copper is a product obtained by performing a heat treatment of the copper oxide at a temperature ranging from about 200° C. to about 550° C. in an oxygen-free atmosphere.

12. The photoelectrochemical cell of claim 5, wherein the content of the metallic copper is in a range of about 0.00001 part by weight to about 0.1 part by weight based on 100 parts by weight of the copper oxide.

* * * * *